(12) United States Patent
Sasaki et al.

(10) Patent No.: US 9,360,205 B2
(45) Date of Patent: Jun. 7, 2016

(54) LIGHTING APPARATUS FOR VACUUM APPARATUS

(75) Inventors: Tomoaki Sasaki, Ibaraki (JP); Akio Chiba, Ibaraki (JP)

(73) Assignee: AVC Co., Ltd., Ibaraki (JP)

( * ) Notice: Subject to any disclaimer, the term of this patent is extended or adjusted under 35 U.S.C. 154(b) by 492 days.

(21) Appl. No.: 13/821,656

(22) PCT Filed: Feb. 21, 2011

(86) PCT No.: PCT/JP2011/053645
§ 371 (c)(1),
(2), (4) Date: May 15, 2013

(87) PCT Pub. No.: WO2012/032798
PCT Pub. Date: Mar. 15, 2012

(65) Prior Publication Data
US 2013/0222572 A1    Aug. 29, 2013

(30) Foreign Application Priority Data

Sep. 9, 2010    (JP) .................................. 2010-201568

(51) Int. Cl.
| | |
|---|---|
| H04N 9/47 | (2006.01) |
| H04N 7/18 | (2006.01) |
| F21V 33/00 | (2006.01) |
| H01L 21/67 | (2006.01) |
| G03B 15/00 | (2006.01) |
| H04N 5/225 | (2006.01) |

(52) U.S. Cl.
CPC ............. *F21V 33/00* (2013.01); *F21V 33/0052* (2013.01); *G03B 15/00* (2013.01); *H01L 21/67253* (2013.01); *G03B 2215/0567* (2013.01); *G03B 2215/0575* (2013.01); *H04N 5/2251* (2013.01)

(58) Field of Classification Search
CPC .............................. F21V 33/00; F21V 33/0052
USPC .............................................. 348/82; 362/125
See application file for complete search history.

(56) References Cited

FOREIGN PATENT DOCUMENTS

| | | |
|---|---|---|
| JP | 2007-194831 | 8/2007 |
| JP | 2007194831 | * 8/2007 |
| JP | 2008-306162 | 12/2008 |
| JP | 2009-006877 | 1/2009 |
| JP | 2009-168612 | 7/2009 |

* cited by examiner

*Primary Examiner* — Jefferey Harold
*Assistant Examiner* — Omer Khalid
(74) *Attorney, Agent, or Firm* — Clark & Brody

(57) ABSTRACT

A lighting apparatus for a vacuum apparatus that allows light to enter the inside of the vacuum apparatus through an observation window and makes it possible to see the inside of the vacuum apparatus through the observation window by illuminating the inside of the vacuum apparatus includes a coupling adapter that is removably coupled to the observation window via a coupling unit, an opening that is formed in a central part of the coupling adapter and allows the inside of the vacuum apparatus to be seen through the observation window, and a plurality of LEDs (light-emitting diodes) that are placed in the coupling adapter and face the observation window. The lighting apparatus is attached to the observation window for seeing the inside of the vacuum apparatus and illuminates the inside of the vacuum apparatus.

9 Claims, 10 Drawing Sheets

LIGHTING APPARATUS FOR VACUUM APPARATUS

TECHNICAL FIELD

The present invention relates to a lighting apparatus for a vacuum apparatus, the lighting apparatus that is attached to an observation window for seeing the inside of the vacuum apparatus and illuminates the inside of the vacuum apparatus.

BACKGROUND ART

There is a hydrogen amount measuring apparatus (a vacuum apparatus) provided with a vacuum chamber that houses an object to be measured, a conveyance unit that is coupled to an end of the vacuum chamber and conveys the object to be measured to the inside of the chamber, a heater that gradually raises the temperature of the vacuum chamber from a low temperature to a high temperature, a partial pressure analyzer that analyzes the hydrogen gas partial pressure of the hydrogen gas released from the object to be measured with an increase in temperature of the object to be measured conveyed to the inside of the vacuum chamber, and a controller that determines the amount of hydrogen contained in the object to be measured based on the hydrogen gas partial pressure output from the partial pressure analyzer (refer to Patent Document 1).

The conveyance unit is formed of a casing having a predetermined volume, a conveyance rod that can be inserted into and pulled out from the inside of the casing, a support member that is attached to an end of the conveyance rod and removably supports the object to be measured, and a guide magnet disposed on the outer periphery of the casing. In this hydrogen amount measuring apparatus, the support member attached to the end of the conveyance rod is made to removably support the object to be measured, the object to be measured is moved from the end of the chamber to a central part of the chamber by using the conveyance rod and the guide magnet, and, after the object to be measured is put on a stage placed in the central part of the chamber, the amount of hydrogen of the object to be measured is measured.

Patent Document 1: JP-A-2009-006877

DISCLOSURE OF INVENTION

Problem to be Solved by the Invention

Though not shown in the drawing, the hydrogen amount measuring apparatus (the vacuum apparatus) disclosed in the above-described gazette is provided with a plurality of observation windows for seeing the inside of the vacuum chamber. The hydrogen amount measuring apparatus allows the object to be measured to be moved to the central part of the chamber and put on the stage while being visually checked through the observation windows. In the hydrogen amount measuring apparatus, a lighting apparatus cannot be placed in the vacuum chamber or the casing, making it necessary to visually check the object to be measured through the observation windows by using the external lighting. However, when the amount of outside lighting is small, the amount of light that enters the insides of the vacuum chamber and the casing through the observation windows is small, making it impossible to illuminate the inside of the chamber and the inside of the casing sufficiently and see the inside of the chamber and the inside of the casing. If it is impossible to see the inside of the vacuum chamber, the object to be measured cannot be visually checked, which sometimes makes it impossible to convey the object to the stage placed in the central part of the chamber and put the object on the stage. Moreover, if it is impossible to see the inside of the casing, when a plurality of objects to be measured are stocked in the casing, sometimes a desired object cannot be picked out from these objects to be measured.

An object of the present invention is to provide a lighting apparatus for a vacuum apparatus, the lighting apparatus that allows light to enter the inside of the vacuum apparatus through an observation window and makes it possible to see the inside of the vacuum apparatus through the observation window by illuminating the inside of the vacuum apparatus. Another object of the present invention is to provide a lighting apparatus for a vacuum apparatus, the lighting apparatus that can reliably convey an object to be vacuum-processed to a predetermined place of the vacuum apparatus while allowing a person to see the inside of the vacuum apparatus by making light enter the inside of the vacuum apparatus through the observation window.

Means for Solving Problem

A premise of the present invention to solve the problems described above is a lighting apparatus for a vacuum apparatus, the lighting apparatus that is attached to an observation window for seeing the inside of a vacuum apparatus and illuminates the inside of the vacuum apparatus.

A feature of the present invention based on the above premise is that a lighting apparatus includes a coupling adapter that is removably coupled to an observation window via a coupling unit, an opening that is formed in a central part of the coupling adapter and allows the inside of a vacuum apparatus to be seen through the observation window, and a plurality of LEDs (light-emitting diodes) that are placed in the coupling adapter and face the observation window.

As an example of the present invention, the coupling adapter is formed of a peripheral wall having a front end portion located on the side where the observation window is located, a rear end portion located on the opposite side of the front end portion, and an intermediate portion located between the front and rear end portions, the peripheral wall extending in an axial direction, and a ring-shaped LED placement plate that is fixed to an inner periphery of the peripheral wall in the intermediate portion thereof and extends inward in a radial direction of the peripheral wall in such a way as to surround the opening, and the plurality of LEDs are placed on an opposite face of the LED placement plate, the opposite face facing the observation window.

As another example of the present invention, the plurality of LEDs are arranged at regular intervals in a circumferential direction of the opposite face of the LED placement plate.

As another example of the present invention, a light diffusing plate that diffuses light radiated from the LEDs is attached to at least one of an inner periphery of the peripheral wall of the coupling adapter in the front end portion and the intermediate portion thereof and the opposite face of the LED placement plate.

As another example of the present invention, a light reflector that reflects light radiated from the LEDs is attached to at least one of an inner periphery of the peripheral wall of the coupling adapter in the front end portion and the intermediate portion thereof and the opposite face of the LED placement plate.

As another example of the present invention, the lighting apparatus includes an image taking device that is removably placed in the rear end portion of the peripheral wall of the coupling adapter and takes an image of the inside of the vacuum apparatus and a display device that displays the image taken by the image taking device.

As another example of the present invention, the image taking device is a CCD camera having a CCD image sensor.

As another example of the present invention, the vacuum apparatus includes a vacuum chamber and a conveyance unit that is coupled to the vacuum chamber and has a conveying unit that conveys an object to be vacuum-processed to the inside of the vacuum chamber, the observation window is formed in at least the vacuum chamber of the vacuum chamber and the conveyance unit, and the lighting apparatus is placed on the observation window formed in at least the vacuum chamber of the vacuum chamber and the conveyance unit.

As another example of the present invention, the display device is placed near the conveying unit of the conveyance unit.

Effect of the Invention

A lighting apparatus for a vacuum apparatus according to the present invention includes a coupling adapter that is removably coupled to an observation window via a coupling unit, an opening that is formed in a central part of the coupling adapter and allows the inside of a vacuum apparatus to be seen through the observation window, and a plurality of LEDs (light-emitting diodes) that are placed in the coupling adapter and face the observation window, and, when the lighting apparatus is placed on the observation window, the light radiated from the LEDs enters the inside of the vacuum apparatus through the observation window and the whole space inside the vacuum apparatus is illuminated with the light, making it possible to see the inside of the vacuum apparatus sufficiently through the observation window and visually check an object to be vacuum-processed placed inside the vacuum apparatus reliably through the observation window.

In the lighting apparatus for a vacuum apparatus, the lighting apparatus in which the coupling adapter includes a peripheral wall having front and rear end portions and an intermediate portion and extending in an axial direction and an LED placement plate that is fixed to an inner periphery of the peripheral wall in the intermediate portion thereof and the plurality of LEDs are placed on an opposite face of the LED placement plate, the opposite face facing the observation window, since the plurality of LEDs are placed on the opposite face of the LED placement plate and the light from the LEDs is radiated from the opposite face of the LED placement plate to the observation window, the light radiated from the LEDs reliably enters the inside of the vacuum apparatus through the observation window and the whole space inside the vacuum apparatus is illuminated with the light, making it possible to see the inside of the vacuum apparatus sufficiently through the observation window and visually check an object to be vacuum-processed placed inside the vacuum apparatus reliably through the observation window.

In the lighting apparatus for a vacuum apparatus, the lighting apparatus in which the plurality of LEDs are arranged at regular intervals in a circumferential direction of the opposite face of the LED placement plate, since the light from the LEDs is radiated from the opposite face of the LED placement plate evenly across the observation window, the light radiated from the LEDs reliably enters the inside of the vacuum apparatus through the observation window and the whole space inside the vacuum apparatus is illuminated with the light, making it possible to see the inside of the vacuum apparatus sufficiently through the observation window and visually check an object to be vacuum-processed placed inside the vacuum apparatus reliably through the observation window.

In the lighting apparatus for a vacuum apparatus, the lighting apparatus in which a light diffusing plate that diffuses light radiated from the LEDs is attached to at least one of an inner periphery of the peripheral wall of the coupling adapter in the front end portion and the intermediate portion thereof and the opposite face of the LED placement plate, since the light radiated from the LEDs is diffused by the diffusing plate and the light from the LEDs is radiated evenly across the observation window, the light radiated from the LEDs reliably enters the inside of the vacuum apparatus through the observation window while being diffused and the whole space inside the vacuum apparatus is illuminated with the light, making it possible to see the inside of the vacuum apparatus sufficiently through the observation window and visually check an object to be vacuum-processed placed inside the vacuum apparatus reliably through the observation window.

In the lighting apparatus for a vacuum apparatus, the lighting apparatus in which a light reflector that reflects light radiated from the LEDs is attached to at least one of an inner periphery of the peripheral wall of the coupling adapter in the front end portion and the intermediate portion thereof and the opposite face of the LED placement plate, even when the light radiated from the LEDs is reflected by the observation window, since the light is reflected by the reflector and enters the observation window again, most of the light radiated from the LEDs enters the inside of the vacuum apparatus through the observation window and the whole space inside the vacuum apparatus is illuminated with the light, making it possible to see the inside of the vacuum apparatus sufficiently through the observation window and visually check an object to be vacuum-processed placed inside the vacuum apparatus reliably through the observation window.

In the lighting apparatus for a vacuum apparatus, the lighting apparatus including an image taking device that is removably placed in the rear end portion of the peripheral wall of the coupling adapter and takes an image of the inside of the vacuum apparatus and a display device that displays the image taken by the image taking device, since there is no need for a person to see the inside of the vacuum apparatus by looking into the observation window and the person can see the inside of the vacuum apparatus by the display device that displays the image taken by the image taking device, even when the person has to operate the vacuum apparatus in a place away from the observation window, it is possible to know the state of the inside of the vacuum apparatus by using the image taking device and the display device and visually check an object to be vacuum-processed placed inside the vacuum apparatus by using the image taking device and the display device. In the lighting apparatus for a vacuum apparatus, since the image taking device can be attached to and removed from the rear end portion of the peripheral wall of the coupling adapter, when the person sees the inside of the vacuum apparatus directly through the observation window without using the image taking device, the person only has to remove the image taking device from the coupling adapter, and the person can see the inside of the vacuum apparatus not only by the image taking device but also by the observation window.

In the lighting apparatus for a vacuum apparatus, the lighting apparatus in which the image taking device is a CCD camera having a CCD image sensor, since it is possible to see the inside of the vacuum apparatus by the display device that displays the image taken by the CCD camera while using the CCD camera, even when a person has to operate the vacuum apparatus in a place away from the observation window, it is possible to know the state of the inside of the vacuum apparatus by using the CCD camera and the display device and visually check an object to be vacuum-processed placed inside the vacuum apparatus by using the CCD camera and the display device. In the lighting apparatus for a vacuum apparatus, since the CCD camera can be attached to and removed from an inner periphery of the peripheral wall of the coupling adapter in the rear end portion thereof, when the person sees the inside of the vacuum apparatus directly through the observation window without using the CCD camera, the person only has to remove the CCD camera from the adapter, and the person can see the inside of the vacuum apparatus not only by the CCD camera but also by the observation window.

In the lighting apparatus for a vacuum apparatus, the lighting apparatus in which the vacuum apparatus includes a vacuum chamber and a conveyance unit having a conveying unit that conveys an object to be vacuum-processed to the inside of the vacuum chamber, the observation window is formed in at least the vacuum chamber of the vacuum chamber and the conveyance unit, and it is placed on the observation window formed in at least the vacuum chamber of the vacuum chamber and the conveyance unit, the light radiated from the LEDs enters the insides of the vacuum chamber and the conveyance unit and the insides of the vacuum chamber and the conveyance unit are illuminated with the light, making it possible to see the insides of the vacuum chamber and the conveyance unit sufficiently by using the observation window and the display device and visually check the object to be vacuum-processed placed in the vacuum chamber from the conveyance unit reliably by using the observation window and the display device. In the lighting apparatus for a vacuum apparatus, when the object to be vacuum-processed is conveyed from the conveyance unit to the vacuum chamber, since the insides of the vacuum chamber and the conveyance unit are illuminated with the light radiated from the LEDs, it is possible to convey the object to be vacuum-processed to a predetermined place in the vacuum chamber from the conveyance unit reliably by using the observation window and the display device.

In the lighting apparatus for a vacuum apparatus, the lighting apparatus in which the display device is placed near the conveying unit of the conveyance unit, since the display device that displays the image taken by the image taking device is placed near the conveying unit of the conveyance unit and it is possible to see the inside of the vacuum apparatus by the display device, even when the conveyance unit is placed in a place away from the observation window and a person has to perform conveyance operation of an object to be vacuum-processed in a place away from the observation window, it is possible to know the state of the inside of the vacuum apparatus by using the image taking device and the display device and visually check the object to be vacuum-processed placed inside the vacuum apparatus by using the image taking device and the display device. In the lighting apparatus for a vacuum apparatus, since the person can convey the object to be vacuum-processed to the vacuum chamber from the conveyance unit while checking the display device, it is possible to convey the object to be vacuum-processed to a predetermined place in the vacuum chamber from the conveyance unit reliably by using the display device.

BEST MODES FOR CARRYING OUT THE INVENTION

Figure 1:
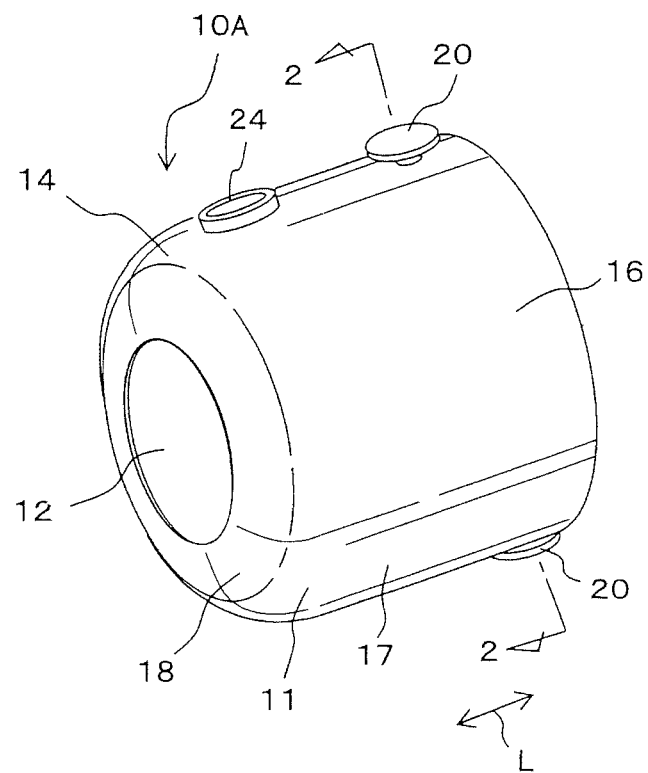
FIG. 1 is a perspective view of a lighting apparatus for a vacuum apparatus, the lighting apparatus illustrated as an example.
Figure 2:
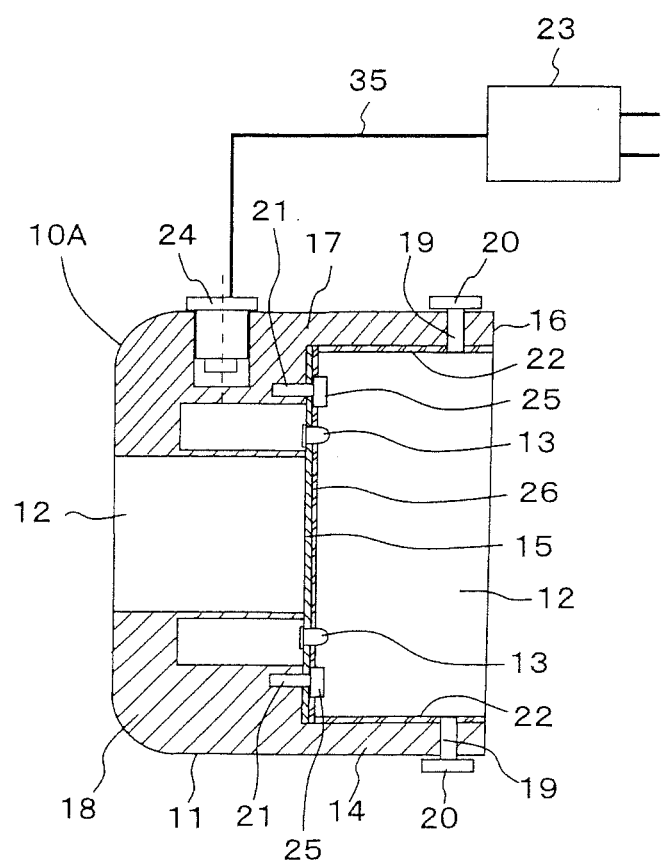
FIG. 2 is a sectional view taken on the line 2-2 of FIG. 1.
Figure 3:
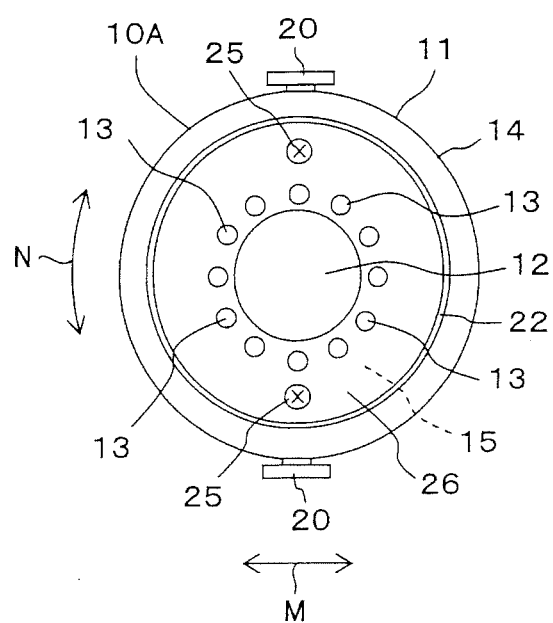
FIG. 3 is a front view of the lighting apparatus for a vacuum apparatus.

The details of a lighting apparatus according to the present invention will be described as follows with reference to the attached drawings such as FIG. 1 which is a perspective view of a lighting apparatus for a vacuum apparatus, the lighting apparatus illustrated as an example. Incidentally, FIG. 2 is a sectional view taken on the line 2-2 of FIG. 1, and FIG. 3 is a front view of a lighting apparatus 10A for a vacuum apparatus. In FIG. 1, an axial direction is indicated by an arrow L. In FIG. 3, a radial direction is indicated by an arrow M and a circumferential direction is indicated by an arrow N. The lighting apparatus 10A for a vacuum apparatus is removably attached to an observation window 60 for seeing the insides of a vacuum chamber 51 and a casing 63 of a vacuum apparatus 50, which will be described later, and illuminates the insides of the chamber 51 and the casing 63 by radiating light into the chamber 51 and the casing 63.

Incidentally, as the vacuum apparatus 50 that can use the lighting apparatus 10A, there are vacuum thin-film forming and processing apparatuses such as a vacuum evaporator, a sputtering apparatus, a dry etching apparatus, an ashing apparatus, a CVD apparatus, and an ion implanter, vacuum chemical apparatuses such as a vacuum reactor, a vacuum distillation apparatus, a vacuum drying apparatus, a vacuum cooling apparatus, a vacuum evaporating/concentrating/crystallizing apparatus, a vacuum impregnating apparatus, a vacuum injecting apparatus, a vacuum defoaming apparatus, a vacuum foaming apparatus, and a vacuum emulsification apparatus, surface analyzers such as an electron detection surface analyzer, an ion detection surface analyzer, and a photodetection surface analyzer, and testing apparatuses such as a helium leak detector, a vacuum fatigue tester, a vacuum bending tester, and a vacuum tensile and compression tester.

The lighting apparatus 10A for a vacuum apparatus has a coupling adapter 11 that is removably coupled to the observation window 60 of the chamber 51 or the casing 63 of the vacuum apparatus 50, a circular opening 12 formed in the central part of the adapter 11, and a plurality of LEDs 13 (light-emitting diodes). The coupling adapter 11 is formed of a peripheral wall 14 and an LED placement plate 15. The peripheral wall 14 is made of ABS resin, is molded in the shape of a cylinder, and extends in an axial direction. The peripheral wall 14 has a front end portion 16, a rear end portion 18 located on the opposite side of the front end portion 16, and an intermediate portion 17 located between the front and rear end portions 16 and 18. The front end portion 16 is a portion on the side where the observation window 60 is located when the lighting apparatus 10A is placed on the observation window 60 of the vacuum apparatus.

In the front end portion 16 of the peripheral wall 14, two coupling screw holes 19 piercing the peripheral wall 14 in a radial direction in positions away from each other 180 degrees are formed. The coupling screw holes 19 have internal threads (not shown). The shafts of coupling screws (coupling units) formed with external threads thread into these coupling screw holes 19. In the intermediate portion 17 of the peripheral wall 14, two fixing screw holes 21 extending in an axial direction are formed. To an inner periphery of the peripheral wall 14 in the front end portion 16 and the intermediate portion 17 thereof, a light diffusing plate 22 is attached. The light diffusing plate 22 is an opalescent plastic plate obtained by incorporating white fine powder such as silica, barium carbonate, or barium titanate into acrylic resin or polycarbonate. The light diffusing plate 22 diffuses the light that has entered the light diffusing plate 22 throughout the light diffusing plate 22.

In the outer surface of the peripheral wall 14 in the rear end portion 18 thereof, a connector fit terminal 24 in which a connector of an electric wire 23 extending from an AC adapter 22 (see FIG. 4) removably fits is formed. The AC adapter 22 supplies direct-current power to the LEDs 13. Incidentally, though not shown in the drawing, to the outer surface of the peripheral wall 14 in the rear end portion 18 thereof, a switch that turns ON/OFF the direct-current power supplied from the AC adapter 22 is attached.

The LED placement plate 15 is made of ABS resin and molded in the shape of an annular ring. The LED placement plate 15 extends inward in the radial direction of the peripheral wall 14 in such a way as to surround the opening 12. The LED placement plate 15 is attached to the inner periphery of the intermediate portion 17 of the peripheral wall 14 via a plurality of fixing screws 25 that thread into the fixing screw holes 21. To an opposite face of the LED placement plate 15, a light reflector 26 that reflects the light radiated from the LEDs 13 is attached. Here, the opposite face of the LED placement plate 15 is a face facing the observation window 60 when the lighting apparatus 10A is placed on the observation window 60 of the vacuum apparatus. As the light reflector 26, a microfoam light reflector made of PET resin is used. The light reflector 26 diffuses and reflects 96% of the light that has entered the light reflector 26. As the light reflector 26, a plate onto which aluminum foil is evaporated or a mirror-finished metal plate can also be used.

The opening 12 pierces the adapter 11 in an axial direction in the central part of the coupling adapter 11. The LEDs 13 are placed on the opposite face of the LED placement plate 15 and are arranged at regular intervals in a circumferential direction on the opposite face of the placement plate 15. In FIG. 3, twelve LEDs 13 are placed on the opposite face of the LED placement plate 15, but the number of LEDs 13 is not limited to that shown in the drawing. Any number of LEDs 13 can be placed on the placement plate 15 in accordance with various conditions such as the output, the size, and the intensity of illumination of the LED 13.

Figure 4:
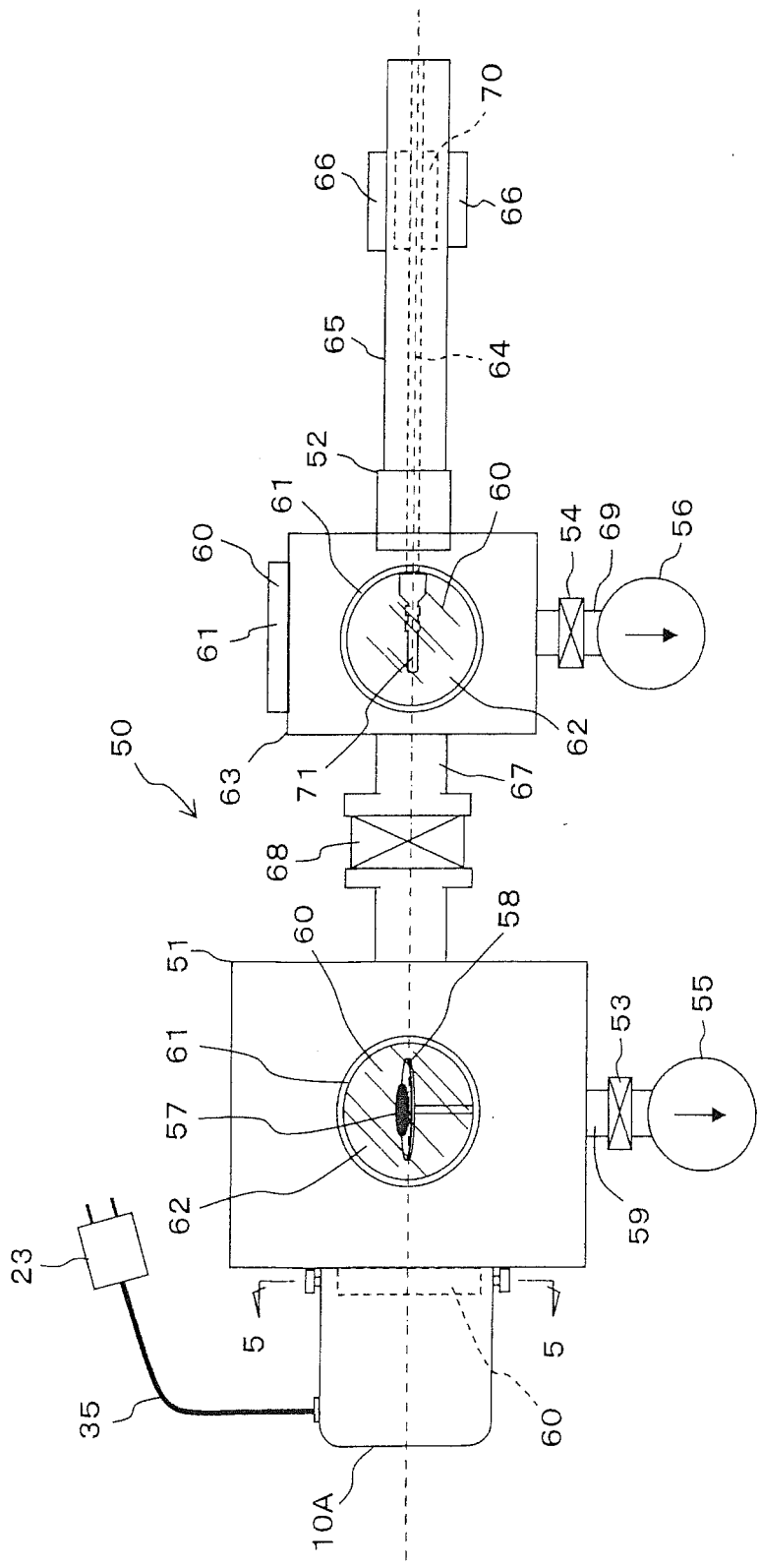
FIG. 4 is a conceptual diagram of the vacuum apparatus shown in a state in which the lighting apparatus of FIG. 1 is placed on an observation window.
Figure 5:
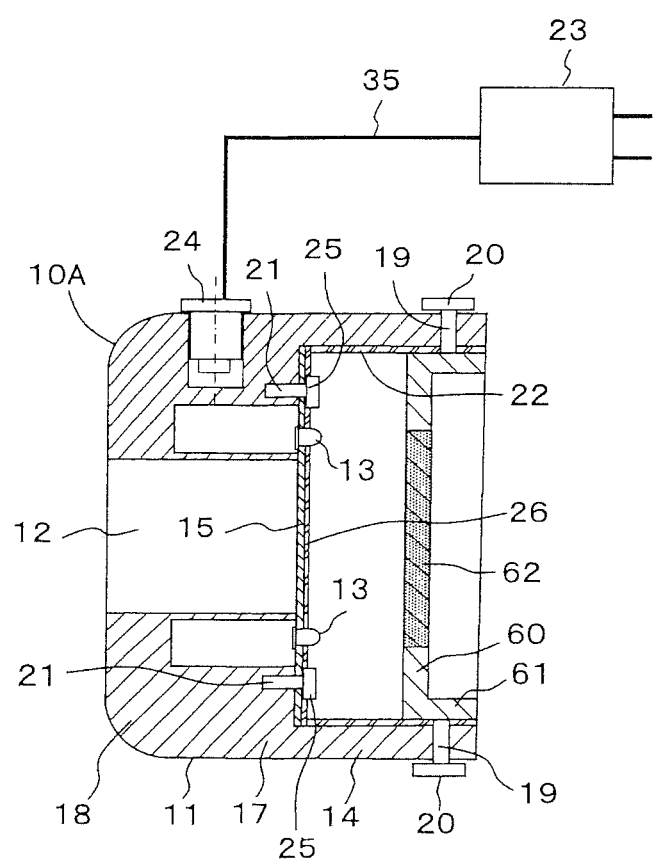
FIG. 5 is a sectional view taken on the line 5-5 indicated by arrows of FIG. 4.

FIG. 4 is a conceptual diagram of the vacuum apparatus 50 shown in a state in which the lighting apparatus 10A for a vacuum apparatus is placed on the observation window 60, and FIG. 5 is a sectional view taken on the line 5-5 indicated by arrows of FIG. 4. In FIG. 4, component devices such as various sensors, an analyzer, an electric furnace, and a controller that form the vacuum apparatus 50 are not shown.

Incidentally, the vacuum apparatus 50 of FIG. 4 is an example, and the vacuum apparatus is not limited to that in the example shown in the drawing. As described earlier, the lighting apparatus 10A can be placed on the observation window 60 of various types of vacuum thin-film forming and processing apparatuses, vacuum chemical apparatuses, surface analyzers, and testing apparatuses.

The vacuum apparatus 50 has the vacuum chamber 51, a conveyance unit 52, vacuum valves 53 and 54, and vacuum pumps 55 and 56. The vacuum chamber 51 is a metal box molded in the shape of a quadrangular prism and is a hexahedron in which six walls having a virtually rectangular shape intersect at right angles. The vacuum chamber 51 can house an object to be vacuum-processed 57 having a predetermined shape. In the vacuum chamber 51, the object to be vacuum-processed 57 is put on a stage 58 (an installation place) placed in the central part of the vacuum chamber 51.

To a wall of the vacuum chamber 51, the vacuum valve 53 and the vacuum pump 55 are coupled. The vacuum valve 53 and the vacuum pump 55 are connected to each other via a vacuum duct 59. In the vacuum duct 59, though not shown in the drawing, a vacuum gage is placed. In two walls of the vacuum chamber 51, the observation windows 60 that allow a person to look inside the chamber 51 are provided. As shown in FIG. 5, these observation windows 60 are each formed of a cylindrical peripheral wall 61 extending from the wall of the vacuum chamber 51 and circular glass 62 fixed to the peripheral wall 61. The peripheral wall 61 is made of metal similar to the metal of which the chamber 51 is made. As the glass 62, tempered glass or heat-resistant glass is used.

The conveyance unit 52 is formed of the casing 63, a conveyance rod 64 which is long in one direction, a conveyance duct 65 which allows insertion and withdrawal of the conveyance rod 64, and a guide magnet 66 disposed on the outer periphery of the conveyance duct 65. The casing 63 is a metal box molded in the shape of a quadrangular prism and is a hexahedron in which six walls having a virtually rectangular shape intersect at right angles. In two walls of the casing 63, the observation windows 60 that allow a person to look inside the casing 63 are provided. These observation windows 60 are each formed of a cylindrical peripheral wall 61 extending from the wall of the casing 63 and circular glass 62 fixed to the peripheral wall 61 (see FIG. 5).

The casing 63 is coupled to the vacuum chamber 51 via a coupling duct 67. In the middle of the coupling duct 67, an openable and closable gate valve 68 is placed. To one of the walls of the casing 63, the vacuum valve 54 and the vacuum pump 56 are coupled. The vacuum valve 54 and the vacuum pump 56 are connected to each other via a vacuum duct 69. In the vacuum duct 69, though not shown in the drawing, a vacuum gage is placed. To one of the walls of the casing 63, the conveyance duct 65 is coupled.

As indicated by an arrow P in FIG. 4, the conveyance rod 64 can move in the conveyance duct 65 in one direction. To one end of the conveyance rod 64, a support member 71 that removably supports the object to be vacuum-processed 57 is attached. To the other end of the conveyance rod 64, a magnet 70 that attracts the guide magnet 66 is attached. To a rear end portion of the conveyance duct 65, though not shown in the drawing, an openable and closable hatch is attached. The conveyance rod 64 passes though the conveyance duct 65 and reaches the inside of the vacuum chamber 51 from the inside of the casing 63. The magnet 66 can move on the outer periphery of the conveyance duct 65 in one direction and can move on the outer periphery of the conveyance duct 65 in a circumferential direction while sliding on the outer periphery of the conveyance duct 65. The conveyance unit 52 conveys the object to be vacuum-processed 57 from the inside of the casing 63 to the central part of the vacuum chamber 51 by using the conveyance rod 64 and conveys the object to be vacuum-processed 57 to the stage 58 of the chamber 51.

The procedure for placing the lighting apparatus 10A on the observation windows 60 of the chamber 51 and the casing 63 of the vacuum apparatus 50 is as follows. The coupling screws 20 threaded onto the front end portion 16 of the coupling adapter 11 of the lighting apparatus 10A are rotated in a counterclockwise direction to retract the tips of the shafts of the screws 20 to the coupling screw holes 19. Next, the front end portion 16 of the coupling adapter 11 is fitted onto the outside of the peripheral wall 61 of the observation window 60, and the adapter 11 is set on the peripheral wall 61 of the observation window 60. Incidentally, the radius of the inner circumferential edge of the front end portion 16 of the coupling adapter 11 is slightly greater than that of the outer circumferential edge of the peripheral wall 61 of the observation window 60, and, when the front end portion 16 of the adapter 11 is fitted onto the peripheral wall 61 of the observation window 60, the inner periphery of the front end portion 16 of the adapter 11 surrounds the outer periphery of the peripheral wall 61 of the observation window 60. After the coupling adapter 11 is set on the peripheral wall 61 of the observation window 60, the coupling screws 20 are rotated in a clockwise direction to make the tips of the shafts of the screws 20 press against the outer periphery of the peripheral wall 61 of the observation window 60, whereby the adapter 11 is fixed to the peripheral wall 61 of the observation window 60.

After the coupling adapter 11 (the lighting apparatus 10A) is fixed to the peripheral wall 61 of the observation window 60 via the coupling screws 20, the switch is turned ON. When the switch is turned ON, the direct-current power is supplied to the LEDs 13 from the AC adapter 22 and light is radiated from the LEDs 13. Of the light radiated from the LEDs 13, the light that has directly entered the glass 62 of the observation window 60 passes through the glass 62 and enters the inside of the vacuum chamber 51 through the observation window. Of the light radiated from the LEDs 13, the light that has entered the light diffusing plate 22 enters the glass 62 of the observation window 60 while being diffused by the diffusing plate 22, passes through the glass 62, and enters the inside of the vacuum chamber 51 through the observation window. Incidentally, the light reflected by the glass 62 is reflected by the light reflector 26 and enters the glass 62 again, passes through the glass 62, and enters the inside of the vacuum chamber 51 through the observation window 60.

The inside of the vacuum chamber 51 becomes bright by being illuminated by the light radiated from the LEDs 13. When the lighting apparatus 10A is placed on the observation window 60 of the casing 63 by the same procedure, the inside of the casing 63 becomes bright by being illuminated by the light radiated from the LEDs 13. Incidentally, when the lighting apparatus 10A is not placed on the observation window 60 of the chamber 51 and the observation window 60 of the casing 63, since the extraneous light does not easily enter the insides of the vacuum chamber 51 and the casing 63 through the observation windows 60 and the insides of the chamber 51 and the casing 63 are gloomy, it is impossible to visually check the insides of the chamber 51 and the casing 63 with clarity.

An example of the procedure for conveying the object to be vacuum-processed 57 to the central part of the vacuum chamber 51 by the conveyance unit 52 while using the lighting apparatus 10A will be described below. First, the vacuum valve 54 of the duct 69 is closed, nitrogen gas is injected into the casing 63 and the conveyance duct 65, and the pressure of the insides of the casing 63 and the conveyance duct 65 becomes atmospheric pressure. At this time, the gate valve 68 is in a closed state, and the vacuum pump 55 coupled to the vacuum chamber 51 is operating. The degree of vacuum of the inside of the vacuum chamber 51 and the vacuum duct 59 is maintained within a range of $1 \times 10^{-7}$ to $1 \times 10^{-10}$ pa by the pump.

After the pressure of the insides of the casing 63 and the conveyance duct 65 return to atmospheric pressure, the support member 71 of the conveyance rod 64 is made to support the object to be vacuum-processed 57, the hatch of the conveyance duct 65 is opened, and the conveyance rod 64 is placed in the conveyance duct 65. At this time, the support member 71 faces the gate valve 68. After the conveyance rod 64 to which the object to be vacuum-processed 57 is attached is placed in the conveyance duct 65, the hatch is closed to seal the conveyance duct 65. After the conveyance duct 65 is sealed, the vacuum valve 54 of the vacuum duct 69 is opened, and the nitrogen gas is discharged to the outside from the casing 63 and the conveyance duct 65 via the vacuum pump 56. After the degree of vacuum of the insides of the casing 63 and the conveyance duct 65 reaches a predetermined degree of vacuum, the gate valve 68 is opened. When the gate valve 68 is opened, the light radiated from the LEDs 13 reaches the casing 63 after passing through the vacuum chamber 51, and the inside of the casing 63 becomes bright by being illuminated by the light radiated from the LEDs 13.

A person can check the state of the object to be vacuum-processed 57 supported by the support member 71 of the conveyance rod 64 by looking into the observation window 60 provided in the casing 63. Incidentally, when a plurality of objects to be vacuum-processed 57 are stocked in the casing 63, a person can identify a desired object 57 in these objects to be measured 57 by looking into the observation window 60 provided in the casing 63 and make the support member 71 of the conveyance rod 64 support the desired object 57.

Next, the guide magnet 66 is moved on the outer periphery of the conveyance duct 65 toward the vacuum chamber 51 in one direction. As a result of the magnets 66 and 70 being attracted to each other by the action of the magnetic force of the magnet 70 of the conveyance rod 64 and the magnetic force of the guide magnet 66, the conveyance rod 64 moves in one direction toward the gate valve 68. When the guide magnet 66 is further moved in one direction toward the vacuum chamber 51, the object to be vacuum-processed 57 supported by the support member 71 of the conveyance rod 64 moves toward the central part of the chamber 51 after passing through the gate valve 68, and the object to be vacuum-processed 57 reaches the stage 58 of the chamber 51. A person can check the movement of the object to be vacuum-processed 57 in the vacuum chamber 51 and the state in which the object to be vacuum-processed 57 has reached the stage 58 of the chamber 51 by looking into the observation window 60.

After the object to be vacuum-processed 57 has reached the stage 58 of the vacuum chamber 51, the guide magnet 66 is moved in a circumferential direction of the conveyance duct 65 to rotate the conveyance rod 64. When the conveyance rod 64 is rotated, the support member 71 rotates, and the object to be vacuum-processed 57 faces a lower portion of the chamber 51. The object to be vacuum-processed 57 is released from the support by the support member 71 in this state and is put on the stage 58 of the chamber 51. After the object to be vacuum-processed 57 is put on the stage 58 of the vacuum chamber 51, the guide magnet 66 is moved in a direction in which the guide magnet 66 moves away from the chamber 51, and the conveyance rod 64 is pulled out of the chamber 51. After the conveyance rod 64 is pulled out of the chamber 51, the gate valve 68 is closed.

By placing the lighting apparatus 10A for a vacuum apparatus on the observation window 60, since the light from the LEDs 13 is radiated from the opposite face of the LED placement plate 15 to the observation window 60, the light radiated from the LEDs 13 enters the insides of the vacuum chamber 51 and the casing 63 through the observation window 60 and illuminates the whole space inside the chamber 51 and the casing 63, making it possible to see the insides of the chamber 51 and the casing 63 through the observation window 60 and visually check the object to be vacuum-processed 57 placed inside the chamber 51 through the observation window 60.

In the lighting apparatus 10A for a vacuum apparatus, since a plurality of LEDs 13 are arranged at regular intervals in a circumferential direction of the opposite face of the LED placement plate 15, the light from the LEDs 13 is radiated from the opposite face of the LED placement plate 15 evenly across the observation window 60. Moreover, since the light diffusing plate 22 that diffuses the light radiated from the LEDs 13 is attached to the inner periphery of the peripheral wall 14 of the coupling adapter 11 in the front end portion 16 and the intermediate portion 17 thereof, the light radiated from the LEDs 13 is diffused by the diffusing plate 22, and the light from the LEDs 13 is radiated evenly across the observation window 60. Furthermore, since the light reflector 26 that reflects the light radiated from the LEDs 13 is attached to the opposite face of the LED placement plate 15, even when the light radiated from the LEDs 13 is reflected by the glass 62 of the observation window 60, the light is reflected by the reflector 26 and enters the observation window 60 again. Therefore, the lighting apparatus 10A allows the light from the LEDs 13 to enter the insides of the chamber 51 and the casing 63 efficiently through the observation window, making it possible to see the insides of the chamber 51 and the casing 63 sufficiently through the observation window 60 by the light from the LEDs 13 and visually check the object to be vacuum-processed 57 placed inside the chamber and the casing 63 reliably through the observation window 60.

Figure 6:
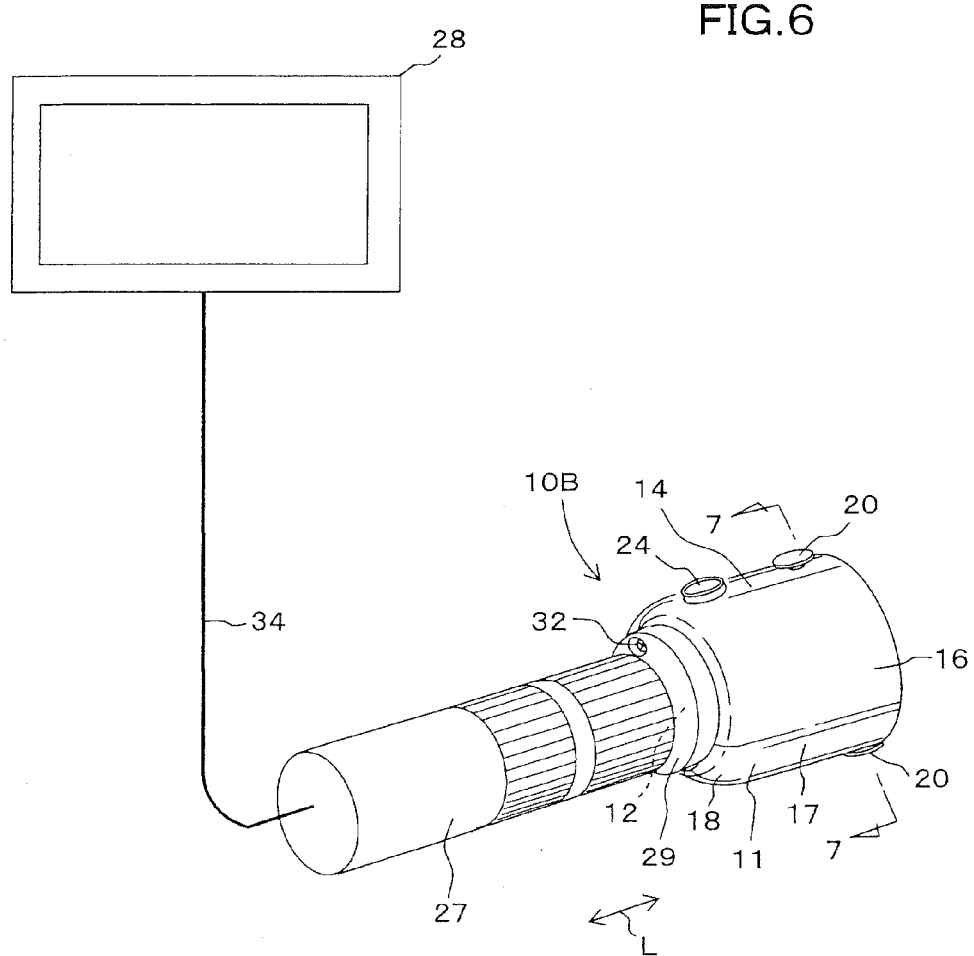
FIG. 6 is a perspective view of a lighting apparatus for a vacuum apparatus, the lighting apparatus illustrated as another example.
Figure 7:
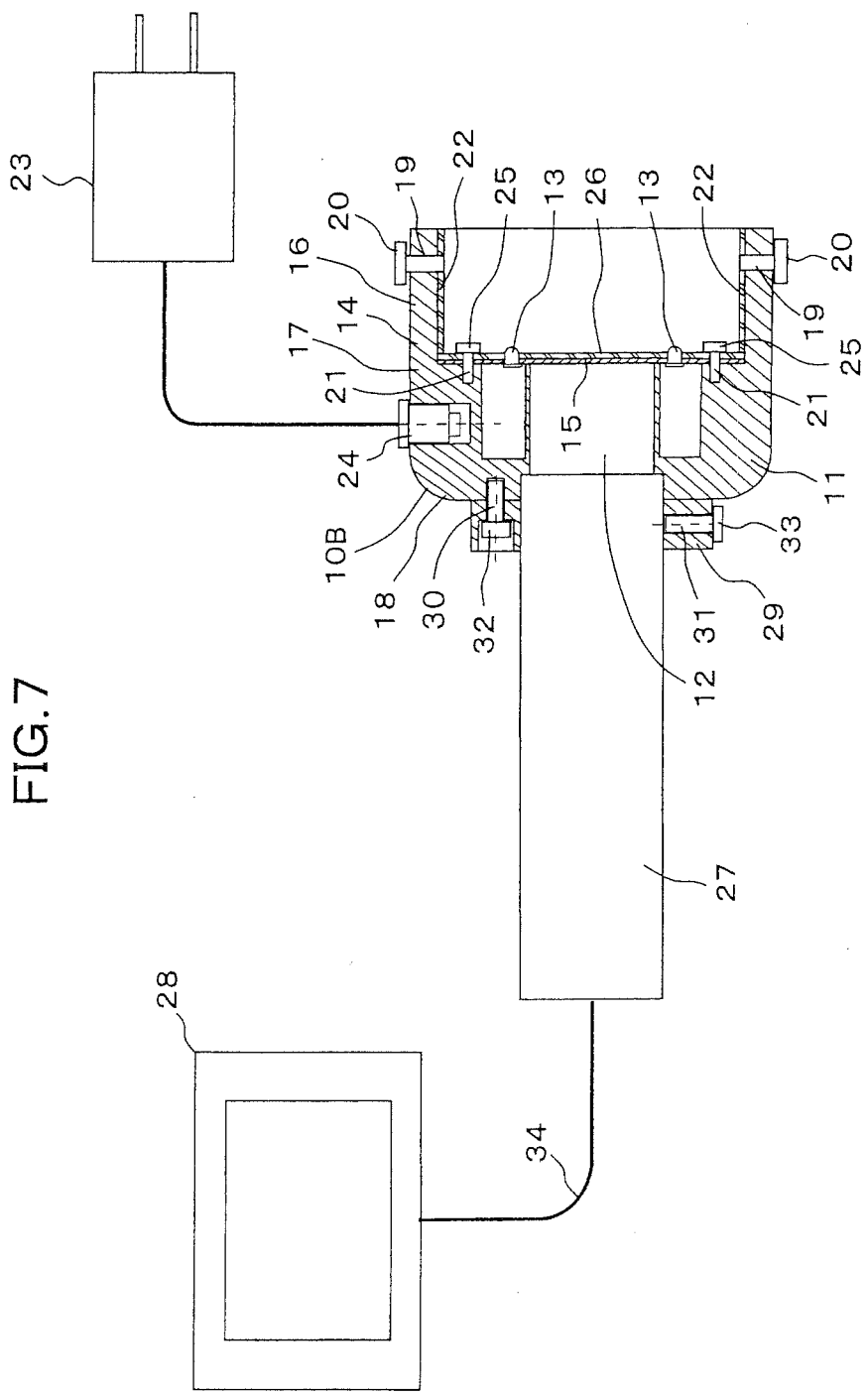
FIG. 7 is a sectional view taken on the line 7-7 indicated by arrows of FIG. 6.
Figure 8:
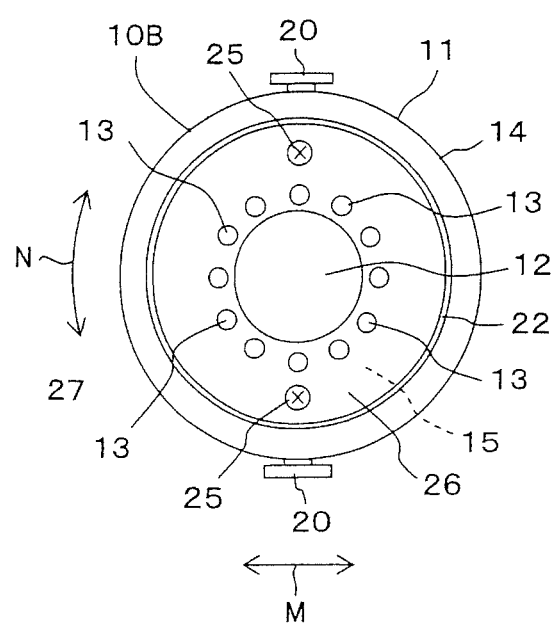
FIG. 8 is a front view of the lighting apparatus for a vacuum apparatus.
Figure 9:
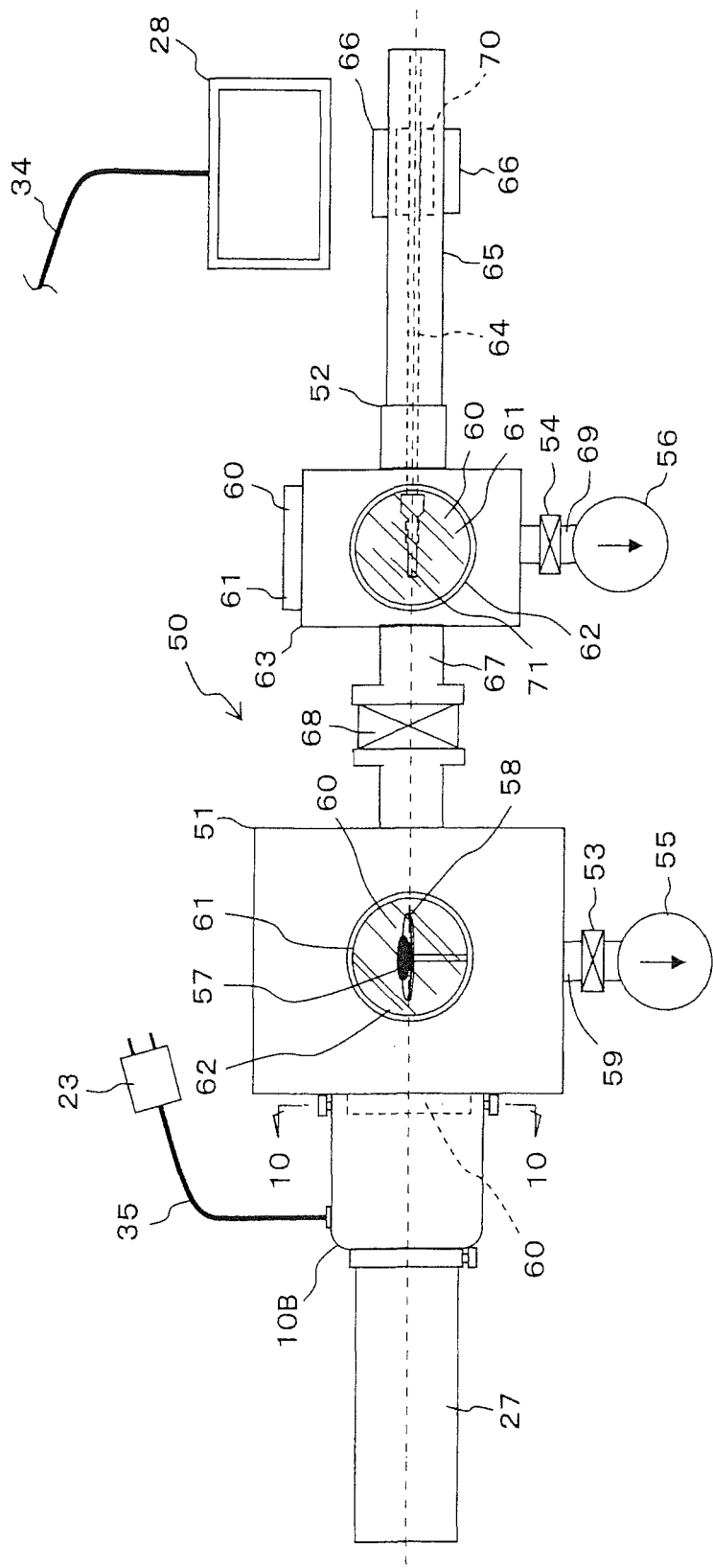
FIG. 9 is a conceptual diagram of the vacuum apparatus shown in a state in which the lighting apparatus of FIG. 6 is placed on an observation window.
Figure 10:
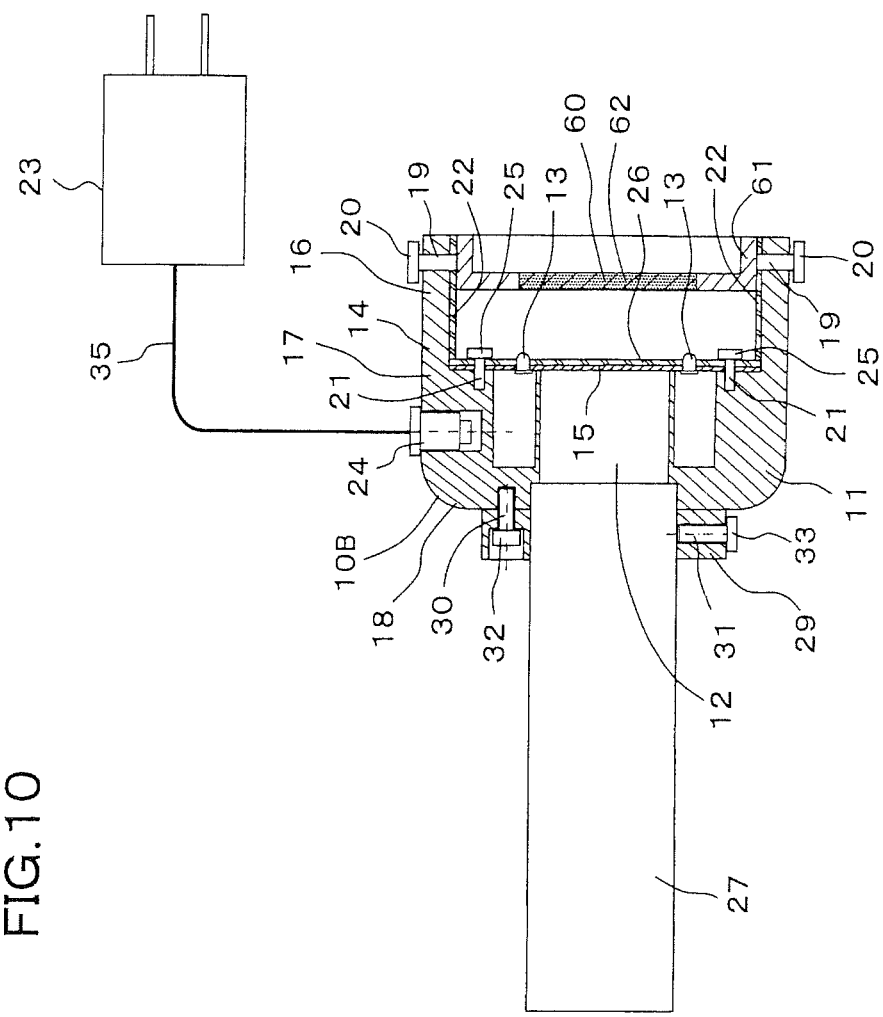
FIG. 10 is a sectional view taken on the line 10-10 indicated by arrows of FIG. 9.

FIG. 6 is a perspective view of a lighting apparatus 10B for a vacuum apparatus, the lighting apparatus 10B illustrated as another example, and FIG. 7 is a sectional view taken on the line 7-7 indicated by arrows of FIG. 6. FIG. 8 is a front view of the lighting apparatus 10B for a vacuum apparatus, and FIG. 9 is a conceptual diagram of a vacuum apparatus 50 shown in a state in which the lighting apparatus 10B for a vacuum apparatus is placed on an observation window 60. FIG. 10 is a sectional view taken on the line 10-10 indicated by arrows of FIG. 9. In FIG. 6, an axial direction is indicated by an arrow L. In FIG. 8, a radial direction is indicated by an arrow M and a circumferential direction is indicated by an arrow N.

The lighting apparatus 10B differs from that of FIG. 1 in that the lighting apparatus 10B has a CCD camera 27 (an imaging device) removably placed on the adapter 11 and a color liquid crystal display 28 (a display device), and, since other component elements are the same as those of the lighting apparatus 10A of FIG. 1, by identifying such components elements with the same reference characters as those of FIG. 1, the detailed explanations of the other component elements of the lighting apparatus 10B will be omitted.

The lighting apparatus 10B for a vacuum apparatus is attached to the observation window 60 for seeing the insides of a chamber 51 and a casing 63 of the vacuum apparatus 50 and illuminates the insides of the chamber 51 and the casing 63 of the vacuum apparatus 50, and takes an image of the insides of the chamber 51 and the casing 63 of the vacuum apparatus 50 by using the CCD camera 27. The lighting apparatus 10B has a coupling adapter 111, a circular opening 12 formed in the central part of the adapter 11, a plurality of LEDs 13, the CCD camera 27, and the display 28.

The coupling adapter 11 is formed of a peripheral wall 14, a camera fixing ring 29, and an LED placement plate 15. The peripheral wall 14 is made of ABS resin, is molded in the shape of a cylinder, and extends in an axial direction. The peripheral wall 14 has front and rear end portions 16 and 18 and an intermediate portion 17. In the peripheral wall 14, in the front end portion 16 thereof, two coupling screw holes 19 are formed, and the shafts of coupling screws 20 (coupling units) thread into these coupling screw holes 19. To an inner periphery of the peripheral wall 14 in the front end portion 16 and the intermediate portion 17 thereof, a light diffusing plate 22 is attached.

To the outer surface of the peripheral wall 14 in the rear end portion 18 thereof, a connector fit terminal 24 is formed and a switch (not shown) that turns ON/OFF is attached. The camera fixing ring 29 is made of ABS resin and is molded in the shape of a cylinder. In the camera fixing ring 29, a fixing screw hole 30 for fixing the camera fixing ring 29 to the adapter 11, the fixing screw hole 30 piercing the camera fixing ring 29 in an axial direction, and a fixing screw hole 31 for fixing the CCD camera 28, the fixing screw hole 31 piercing the camera fixing ring 29 in a radial direction, are formed. These fixing screw holes 30 and 31 have internal threads (not shown). The camera fixing ring 29 is fixed to the rear end portion 18 of the peripheral wall 14 via a fixing screw 32 that threads into the screw hole 30.

The LED placement plate 15 is made of ABS resin and is molded in the shape of an annular ring. The LED placement plate 15 extends inward in the radial direction of the peripheral wall 14 in such a way as to surround the opening 12 and is attached to the inner periphery of the intermediate portion 17 of the peripheral wall 14. To an opposite face of the LED placement plate 15, a light reflector 26 is attached. The opening 12 pierces the adapter 11 in an axial direction in the central part of the coupling adapter 11.

The CCD camera 27 is placed in the rear end portion 18 of the adapter 11 in such a way that a lens of the CCD camera 17 faces the front end portion 16 of the adapter 11, and is fixed to the camera fixing ring 29 via a fixing screw 33 that threads into the screw hole 31. The display 28 is connected to the CCD camera 27 via an interface 34, and, as shown in FIG. 8, is placed near a conveyance duct 65 (a conveying unit) of a conveyance unit 52. The display 28 displays the images of the insides of the chamber 51 and the casing 63 of the vacuum apparatus 50, the images taken by the CCD camera 27.

The procedure for placing the CCD camera 27 in the coupling adapter 11 is as follows. The fixing screw 33 that threads into the fixing screw hole 31 of the camera fixing ring 29 is rotated in a counterclockwise direction to retract the tip of the shaft of the screw 33 to the inside of the fixing ring 29. Next, the lens-side tip of the CCD camera 27 is inserted into the fixing ring 29, and the camera 27 is set on the coupling adapter 11. Incidentally, the radius of the inner circumferential edge of the camera fixing ring 29 and the inner circumferential edge of the front end portion 16 of the adapter 11 is slightly greater than the radius of the outer circumferential edge of the CCD camera 27, and, when the front end portion of the camera 27 is fitted into the ring 29 and the adapter 11, the inner periphery of the ring 29 and the inner periphery of the rear end portion 18 of the adapter 11 surround the outer periphery of the camera 27. After the CCD camera 27 is set on the coupling adapter 11, the fixing screw 33 is rotated in a clockwise direction to make the tip of the shaft of the screw 33 press against the outer periphery of the camera 27, whereby the camera 27 is fixed to the adapter 11.

The structure of the vacuum apparatus 50 is the same as that of FIG. 5. Moreover, since the procedure for placing the lighting apparatus 10B on the observation windows 60 of the chamber 51 and the casing 63 of the vacuum apparatus 50 is the same as that of FIG. 5, the explanation thereof is omitted by quoting the explanation of FIG. 5. After the lighting apparatus 10B is fixed to a peripheral wall 61 of the observation window 60, the switch of the lighting apparatus 10B is turned ON and the switches of the CCD camera 27 and the display 28 are turned ON. When the switches are turned ON, the direct-current power is supplied to the LEDs 13 from an AC adapter 22 and light is radiated from the LEDs 13.

Of the light radiated from the LEDs 13, the light that has directly entered the glass 62 of the observation window passes through the glass 62 and enters the vacuum chamber 51 through the observation window 60. Of the light radiated from the LEDs 13, the light that has entered the light diffusing plate 22 enters the glass 62 of the observation window 60 while being diffused by the diffusing plate 22, passes through the glass 62, and enters the vacuum chamber 51 through the observation window 60. Incidentally, the light reflected by the glass 62 is reflected by the light reflector 26 and enters the glass 62 again, passes through the glass 62, and enters the vacuum chamber 51 through the observation window 60.

The inside of the vacuum chamber 51 becomes bright by being illuminated by the light radiated from the LEDs 13. An image of the state of the inside of the vacuum chamber 51 is taken by the CCD camera 27 and is displayed on the display 28. When the lighting apparatus 10B is placed on the observation window 60 of the casing 63, the inside of the casing 63 becomes bright by being illuminated by the light radiated from the LEDs 13. An image of the state of the inside of the casing 63 is taken by the CCD camera 27 and is displayed on the display 28. Incidentally, when the lighting apparatus 10B is not placed on the observation window 60 of the chamber 51 and the observation window 60 of the casing 63, since the extraneous light does not easily enter the inside of the vacuum chamber 51 and the inside of the casing 63 through the observation windows 60 and the insides of the chamber 51 and the casing 63 are gloomy, it is impossible to take a clear image of the state of the insides of the chamber 51 and the casing 63.

The vacuum apparatus 50 conveys the object to be vacuum-processed 57 to the stage 58 of the vacuum chamber 51 by the conveyance unit 52 while using the LEDs 13, the CCD camera 27, and the display 28. A person performs conveyance operation while checking the images taken by the CCD camera 27 on the display 28. Since the procedure for conveying the object to be vacuum-processed 57 to the stage 58 of the vacuum chamber 51 is the same as that of FIG. 5, the explanation thereof is omitted by quoting the explanation of FIG. 5.

In addition to the advantages of that of FIG. 1, the lighting apparatus 10B for a vacuum apparatus has the following advantages. Since the lighting apparatus 10B eliminates the need for a person to see the insides of the vacuum chamber 51 and the casing 63 of the vacuum apparatus 50 by looking into the observation window 60 and allows the person to see the insides of the vacuum chamber 51 and the casing 63 of the vacuum chamber 50 by the display 28 that displays the image taken by the CCD camera 27 while using the CCD camera 27, even when the person has to operate the vacuum chamber 50 in a place away from the observation window 60, it is possible to know the state of the insides of the vacuum chamber 51 and the casing 63 by using the CCD camera 27 and the display device 28 and visually check the object to be vacuum-processed 57 placed inside the vacuum chamber 51 by using the CCD camera 27 and the display device 28.

In the lighting apparatus 10B for a vacuum apparatus, since the CCD camera 27 can be attached to and removed from the rear end portion 18 of the peripheral wall 14 of the coupling adapter 11 via the camera fixing ring 29, when a person sees the insides of the vacuum chamber 51 and the casing 63 of the vacuum apparatus 50 directly through the observation window 60 without using the CCD camera 27, the person only has to remove the CCD camera 27 from the adapter 11, and the person can see the insides of the vacuum chamber 51 and the casing 63 not only by the CCD camera 27 but also by the observation window 60. With the lighting apparatus 10B for a vacuum apparatus, when the object to be vacuum-processed 57 is conveyed to the vacuum chamber 51 from the conveyance unit 52, since the insides of the vacuum chamber 51 and the conveyance unit 52 are illuminated with the light radiated from the LEDs 13, it is possible to convey the object to be vacuum-processed 57 to the stage 58 of the vacuum chamber 51 from the conveyance unit 52 reliably by using the observation window 60 and the display 28.

In the lighting apparatuses 10A and 10B shown in the drawings, the light diffusing plate 22 is attached to the inner periphery of the peripheral wall 14 in the front end portion 16 and the intermediate portion 17 thereof and the light reflector 26 is attached to the opposite face of the LED placement plate 15, but the light diffusing plate 22 and the light reflector 26 may not be attached to these faces. Moreover, the light reflector 26 may be attached to the inner periphery of the peripheral wall 14 in the front end portion 16 and the intermediate portion 17 thereof, and the light diffusing plate 22 may be attached to the opposite face of the LED placement plate 15. In the lighting apparatuses 10A and 10B, the light diffusing plate 22 may be attached to the inner periphery of the peripheral wall 14 in the front end portion 16 and the intermediate portion 17 thereof, and the light diffusing plate 22 may be attached to the opposite face of the LED placement plate 15. Furthermore, the light reflector 26 may be attached to the inner periphery of the peripheral wall 14 in the front end portion 16 and the intermediate portion 17 thereof, and the light reflector 26 may be attached to the opposite face of the LED placement plate 15.

EXPLANATIONS OF LETTERS OR NUMERALS

10A lighting apparatus for a vacuum apparatus
10B lighting apparatus for a vacuum apparatus
11 coupling adapter
12 opening
13 LED (light-emitting diode)
14 peripheral wall
15 LED placement plate
16 front end portion
17 intermediate portion
18 rear end portion
22 light diffusing plate
26 light reflector
27 CCD camera (image taking device)
28 display (display device)
50 vacuum apparatus
51 vacuum chamber
52 conveyance unit
60 observation window

The invention claimed is:
1. A lighting apparatus for a vacuum apparatus, the lighting apparatus that is attached to an observation window for seeing the inside of a vacuum apparatus and illuminates the inside of the vacuum apparatus, wherein the lighting apparatus includes a coupling adapter that is removably coupled to the observation window via a coupling unit, an opening that is formed in a central part of the coupling adapter and allows the inside of the vacuum apparatus to be seen through the observation window, and a plurality of LEDs (light-emitting diodes) that are placed in the coupling adapter and face the observation window, and that the coupling adapter is formed of:

a peripheral wall having a front end portion being located on the side where the observation window extending from the wall of the vacuum apparatus is located, and being fittable onto the outside of a peripheral wall of the observation window, a rear end portion located on the opposite side of the front end portion, and an intermediate portion located between the front and rear end portions, the peripheral wall extending in an axial direction; and a ring-shaped LED placement plate that is fixed to an inner periphery of the peripheral wall in the intermediate portion thereof and extends inward in a radial direction of the peripheral wall in such a way as to surround the opening, and the plurality of LEDs are placed on an opposite face of the LED placement plate, the opposite face facing the observation window.

2. The lighting apparatus for a vacuum apparatus according to claim 1, wherein when the front end portion of the peripheral wall of the coupling adapter is fittable onto the peripheral wall of the observation window, the inner periphery of the front end portion of the adapter surrounds the outer periphery of the peripheral wall of the observation window.

3. The lighting apparatus for a vacuum apparatus according to claim 2, wherein the plurality of LEDs are arranged at regular intervals in a circumferential direction of the opposite face of the LED placement plate.

4. The lighting apparatus for a vacuum apparatus according to claim 2, wherein a light diffusing plate that diffuses light radiated from the LEDs is attached to at least one of an inner periphery of the peripheral wall of the coupling adapter in the front end portion and the intermediate portion thereof and the opposite face of the LED placement plate.

5. The lighting apparatus for a vacuum apparatus according to claim 2, wherein a light reflector that reflects light radiated from the LEDs is attached to at least one of an inner periphery of the peripheral wall of the coupling adapter in the front end portion and the intermediate portion thereof and the opposite face of the LED placement plate.

6. The lighting apparatus for a vacuum apparatus according to claim 1, wherein the lighting apparatus includes an image taking device that is removably placed in the rear end portion of the peripheral wall of the coupling adapter and takes an image of the inside of the vacuum apparatus and a display device that displays the image taken by the image taking device.

7. The lighting apparatus for a vacuum apparatus according to claim 6, wherein the image taking device is a CCD camera having a CCD image sensor.

8. The lighting apparatus for a vacuum apparatus according to claim 1, wherein the vacuum apparatus includes a vacuum chamber and a conveyance unit that is coupled to the vacuum chamber and has a conveying unit that conveys an object to be vacuum-processed to the inside of the vacuum chamber, the observation window is formed in at least the vacuum chamber of the vacuum chamber and the conveyance unit, and the lighting apparatus is placed on the observation window formed in at least the vacuum chamber of the vacuum chamber and the conveyance unit.

9. The lighting apparatus for a vacuum apparatus according to claim 8, wherein the display device is placed near the conveying unit of the conveyance unit.

\* \* \* \* \*